United States Patent
Zhang et al.

(10) Patent No.: US 10,882,211 B2
(45) Date of Patent: Jan. 5, 2021

(54) CEMENT SINTERING DEVICE AND CEMENT SINTERING METHOD

(71) Applicants: BOE TECHNOLOGY GROUP CO., LTD., Beijing (CN); ORDOS YUANSHENG OPTOELECTRONICS CO., LTD., Inner Mongolia (CN)

(72) Inventors: Liang Zhang, Beijing (CN); Xu Chen, Beijing (CN); Chunchieh Huang, Beijing (CN); Shanshan Bao, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

(*) Notice: Subject to any disclaimer, the term of this patent is extended or adjusted under 35 U.S.C. 154(b) by 338 days.

(21) Appl. No.: 15/988,531

(22) Filed: May 24, 2018

(65) Prior Publication Data
US 2019/0054655 A1 Feb. 21, 2019

(30) Foreign Application Priority Data
Aug. 21, 2017 (CN) .......................... 2017 1 0718959

(51) Int. Cl.
*B28B 11/24* (2006.01)
*C03B 19/06* (2006.01)
(Continued)

(52) U.S. Cl.
CPC ............ *B28B 11/243* (2013.01); *B23K 26/21* (2015.10); *C03B 19/06* (2013.01);
(Continued)

(58) Field of Classification Search
CPC ....... B28B 11/24; B28B 11/243; C03B 19/06; C03C 23/0025; H01L 51/5246
See application file for complete search history.

(56) References Cited

U.S. PATENT DOCUMENTS 6,064,034 A * 5/2000 Rieck ................... B23K 26/032
219/121.84
9,391,294 B1 * 7/2016 Xiao ................... H01L 51/5246
(Continued)

FOREIGN PATENT DOCUMENTS

CN 103482857 A 1/2014
CN 103928638 A * 7/2014 ........... H01L 51/448
(Continued)

OTHER PUBLICATIONS

First Office Action for Chinese Application No. 201710718959.2, dated Sep. 5, 2018, 8 Pages.

*Primary Examiner* — Cachet I Proctor
(74) *Attorney, Agent, or Firm* — Brooks Kushman P.C.

(57) ABSTRACT

The present disclosure provides a cement sintering device and a cement sintering method. The cement sintering device comprises an emitting module configured to emit laser to an irradiation area corresponding to the emitting module; a moving module configured to control the irradiation area of the emitting module to move so that the irradiation area covers a cement to be sintered and is moved along an extension direction of the cement; a detecting module configured to detect structural information about the cement covered by the irradiation area; and a control module configured to adjust operation parameters of the emitting module for emitting the laser based on the structural information. Based on the solution of the present disclosure, it is possible to achieve the effect of more accurately sintering.

15 Claims, 3 Drawing Sheets

(51) Int. Cl.
  *H01L 51/56* (2006.01)
  *C04B 7/44* (2006.01)
  *B23K 26/21* (2014.01)
  *H01L 51/52* (2006.01)
  *C03C 23/00* (2006.01)

(52) U.S. Cl.
  CPC ........ *C03C 23/0025* (2013.01); *C04B 7/4461* (2013.01); *H01L 51/5237* (2013.01); *H01L 51/56* (2013.01); *H01L 51/5246* (2013.01)

(56) References Cited

U.S. PATENT DOCUMENTS

| | | | | |
|---|---|---|---|---|
| 2009/0189345 A1* | 7/2009 | Smith | .................... | G07F 17/34 |
| | | | | 273/143 R |
| 2016/0300769 A1* | 10/2016 | Yang | .................. | G01B 11/0616 |
| 2016/0361843 A1* | 12/2016 | Xiao | ........................ | H01L 51/56 |

FOREIGN PATENT DOCUMENTS

| | | | |
|---|---|---|---|
| CN | 104362262 A | | 2/2015 |
| CN | 105679970 A | * | 6/2016 |
| CN | 105679970 A | | 6/2016 |
| CN | 105810847 A | | 7/2016 |
| CN | 106328680 A | | 1/2017 |
| CN | 107026186 A | | 8/2017 |
| KR | 20120111247 A | | 10/2012 |

* cited by examiner

CEMENT SINTERING DEVICE AND CEMENT SINTERING METHOD

CROSS-REFERENCE TO RELATED APPLICATION

This application claims priority to Chinese Patent Application No. 201710718959.2 filed on Aug. 21, 2017, which is incorporated herein by reference in its entirety.

TECHNICAL FIELD

The present disclosure relates to the field of encapsulation, in particular to a cement sintering device and a cement sintering method.

BACKGROUND

The organic light-emitting diode (OLED) in the related art products are encapsulated with glass cement. The glass cement is applied using screen printing technology. Due to factors such as unequal screen tension during the printing, there will be a great difference in width between different portions of the formed glass cement. In other words, the glass cement formed using the printing technology in the related art is not uniform enough in the width thereof.

Currently, laser is used to sinter the glass cement. When the glass cement with greatly varied widths is sintered by laser, a part of the glass cement may not be fully sintered; or another part of the glass cement may be excessively sintered, and this causes damage to the light-emitting layer of the OLED product.

Obviously, these problems will affect the quality of the OLED products, and thus need to be solved.

SUMMARY

In the process of sintering glass cement using laser, a portion of the glass cement having a larger width needs more melting energy, while the other portion of the glass cement having a relatively smaller width needs less melting energy. If operation parameters for emitting laser cannot be flexibly adjusted according to actual structures of the glass cement, when the laser is used with the same operation parameters to sinter the glass cement with greatly varied widths, a part of the glass cement may not be fully sintered; or another part of the glass cement may be excessively sintered, and this causes damage to a light-emitting layer of the OLED product and affects the quality of the OLED product.

To this end, an object of the present disclosure is to provide a laser sintering solution, capable of adjusting the operation parameters for emitting laser according to an actual size of the cement to be sintered during the sintering, so that the energy of the laser is matched with that required for melting the cement, thereby achieving more ideal sintering quality.

To realize this object, one embodiment of the present disclosure provides a cement sintering device which includes:
an emitting module configured to emit laser to an irradiation area corresponding to the emitting module;
a moving module configured to control the irradiation area of the emitting module to move so that the irradiation area covers a cement to be sintered and is moved along an extension direction of the cement;
a detecting module configured to detect structural information about the cement covered by the irradiation area; and
a control module configured to adjust operation parameters of the emitting module for emitting laser based on the structural information.

In one example, the moving module may be further configured to move the irradiation area by moving the emitting module or by changing a laser emitting angle of the emitting module.

In one example, the detecting module is configured to detect a width of the cement covered by the irradiation area in a first direction and the first direction is perpendicular to the extension direction of the cement.

In one example, the control module is further configured to adjust a size of a spot formed by the laser emitted by the emitting module based on the width of the cement obtained by the detecting module.

In one example, the control module is further configured to adjust a radius R of the spot formed by the laser emitted by the emitting module according to a formula $$R = \frac{\sqrt{\left(\frac{JV}{W}\right)^2 + D^2}}{2},$$

in which D is the width of the cement obtained by the detecting module, J is energy required for melting the cement and there is a preset correspondence between energy J and information about a material of the cement; V is a speed at which the irradiation area is moved by the moving module, and W is power of the emitting module for emitting the laser.

In one example, the control module is further configured to store therein the preset correspondence between the energy J required for melting the cement and the information about the material of the cement.

In one example, the cement sintering device includes at least one emitting module as described above, each emitting module corresponds to one moving module and one detecting module as described above, each moving module is configured to control the irradiation area of the corresponding emitting module to move, and each detecting module is configured to detect structural information about the cement covered by the irradiation area of the corresponding emitting module.

One embodiment of the present disclosure provides a cement sintering method that includes:
emitting laser to an irradiation area;
moving the irradiation area so that the irradiation area covers a sintering starting position of cement and is moved along an extension direction of the cement;
detecting structural information about the cement covered by the irradiation area; and
adjusting operation parameters for emitting the laser based on the structural information.

In one example, the cement sintering method includes:
determining the structural information about the cement to be sintered at the sintering starting position;
determining initial operation parameters for emitting the laser based on the structural information about the cement at the sintering starting position;
emitting the laser to the irradiation area based on the initial operation parameters;

moving the irradiation area so that the irradiation area covers the sintering starting position of the cement and is moved along the extension direction of the cement;

obtaining the structural information about the cement covered by the irradiation area in real time during the movement of the irradiation area; and adjusting the operation parameters for emitting the laser based on the structural information obtained in real time.

In one example, the structural information includes a width of the cement in a first direction and the first direction is perpendicular to the extension direction of the cement.

In one example, the operation parameters include a size of a spot formed by the emitted laser.

In one example, the operation parameters comprise a radius of the spot formed by the emitted laser.

In one example, the radius R of the spot is calculated according to $$R = \frac{\sqrt{\left(\frac{JV}{W}\right)^2 + D^2}}{2},$$

in which D is the detected width of the cement, J is energy required for melting the cement and there is a preset correspondence between the energy and the information about the material of the cement; V is a speed at which the irradiation area is moved, and W is power for emitting the laser.

DETAILED DESCRIPTION

Figure 1:
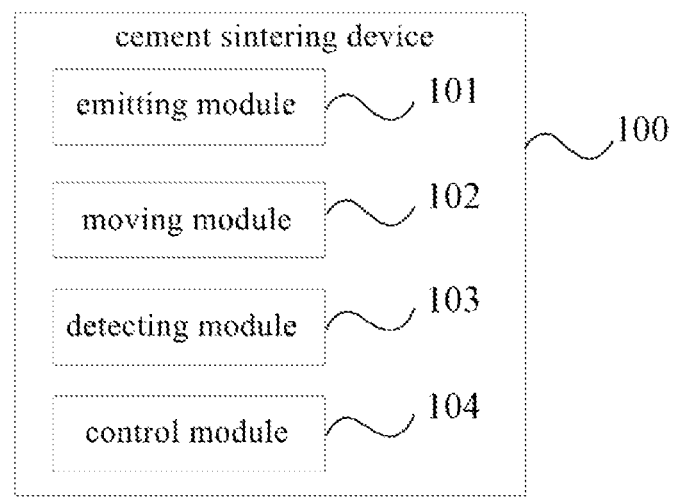
FIG. 1 is a structural schematic view of a cement sintering device provided in an embodiment of the present disclosure.

To make the technical problems to be solved, technical solutions and advantages of the present disclosure more apparent, the present disclosure will be described hereinafter in detail in conjunction with the drawings and specific embodiments. In the following description, particular details such as specific configurations and components are provided merely to facilitate full understanding of the present disclosure. Therefore, it should be understood by those skilled in the art that various variations and modifications can be made to the embodiments described herein without departing from the scope and spirit of the present disclosure. In addition, description of known functions and constructions is omitted for clarity and conciseness.

It should be understood that "one embodiment" or "an embodiment" mentioned throughout the specification means that specific features, structures or characteristics related to the embodiment are included in at least one embodiment of the present disclosure. Therefore, the phrase "one embodiment" or "an embodiment" that appears in various places throughout the specification does not necessarily refer to the same embodiment. In addition, these specific features, structures or characteristics may be combined in one or more embodiments in any suitable manner.

It should be understood that, in various embodiments of the present disclosure, sequence numbers of the following processes do not mean execution sequences. The execution sequences of the processes should be determined according to functions and internal logic thereof, and should not be construed as any limitation of implementation processes of the embodiments of the present disclosure.

In order to solve the problems existing in the related art, the present disclosure provides a technical solution capable of adaptively adjusting operation parameters for emitting laser based on a structure of a cement to be sintered.

One embodiment of the present disclosure provides a cement sintering device 100 that includes an emitting module 101, a moving module 102, a detecting module 103 and a control module 104.

The emitting module 101 is configured to emit laser to an irradiation area corresponding to the emitting module 101.

In an example, a laser emitter may be used as the emitting module 101.

The moving module 102 is configured to control the irradiation area of the emitting module 101 to move so that the irradiation area covers a cement to be sintered and is moved along an extension direction of the cement.

In an example, the moving module 102 may be, for example, a mechanical arm or the like. In an example, the moving module 102 may be further configured to move the irradiation area by moving the emitting module 101 or by changing a laser emitting angle of the emitting module 101.

The detecting module 103 is configured to detect structural information about the cement covered by the irradiation area.

In one example, the detecting module 103 may be a sensor provided on the emitting module 101, which can scan the cement covered by the irradiation area so as to obtain structural information about the cement. The function of the detecting module 103 can be achieved using a sensor known from the prior art, and thus will not be repeated herein by way of example.

The control module 104 is configured to adjust operation parameters of the emitting module 101 for emitting laser based on the structural information.

In one example, the control module 104 may be an electronic component having a processing function, such as a central processing unit (CPU), a programmable logic controller (PLC) or an integrated circuit, or the control module 104 may be a terminal control device having a processing function such as a personal computer (PC). The control module 104 can store a computer program and execute the above-mentioned function using the computer program.

As can therefore be seen, when carrying out laser sintering using the cement sintering device of this embodiment, the detecting module may measure an actual size of the cement on the sintering path and feedback the measured values to the control module. The control module may adjust operation parameters of the emitting module for emitting laser based on the actual size so that energy of the laser is matched with the energy actually required for melting the cement, so as to realize the effect of more accurately sintering. As a result, it is possible to improve the quality of sintering while reducing the risk of laser burns in other areas.

In one example, the cement sintering device may include at least one emitting module 101, each emitting module 101 corresponds to one moving module 102 and one detecting module 103. Each moving module 102 is configured to move an irradiation area of the corresponding emitting module 101, while each detecting module 103 detects only structural information about the cement covered by the irradiation area of the corresponding emitting module 101.

Correspondingly, the control module 104 can adjust operation parameters of the corresponding emitting module 101 for emitting the laser based on the structural information.

Below, the cement sintering device of this embodiment will be described in detail by taking one control module 104 for example.

Figure 2:
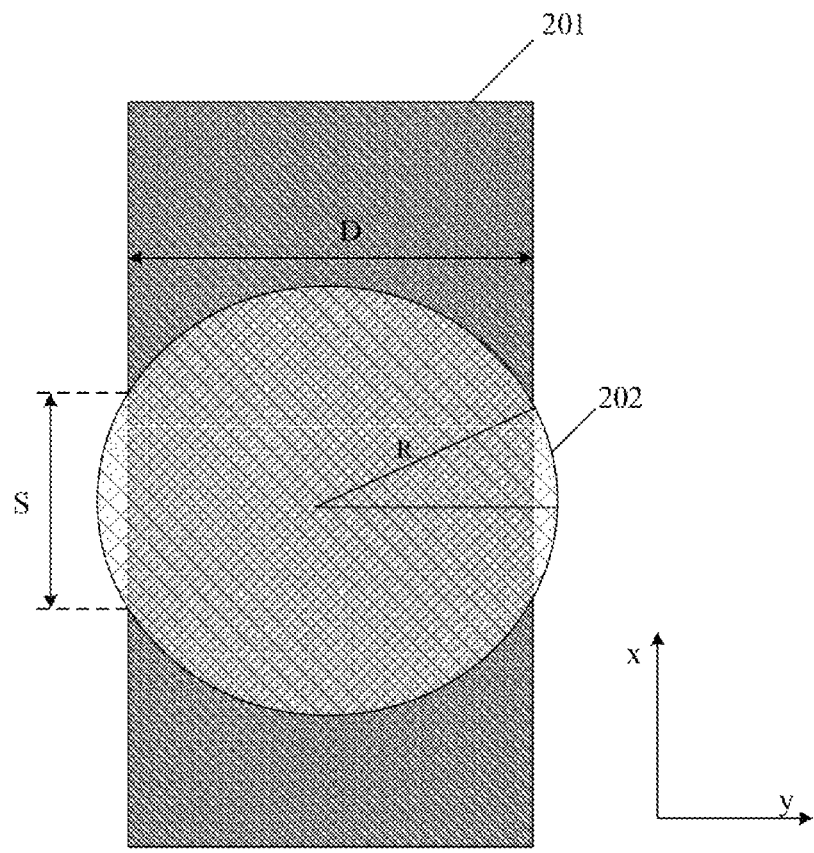
FIG. 2 is a schematic view showing a positional relationship between a cement to be sintered and a laser spot emitted by the cement sintering device provided in the embodiment of the present disclosure.

As shown in FIG. 2, assuming that a cement 201 to be sintered extends in an x axis, the detecting module 103 of this embodiment is configured to detect a width D of the cement 201 covered by the irradiation area in a first direction and the first direction is perpendicular to an extension direction of the cement. Assuming that the extension direction of the cement is the x axis direction, the first direction is a y axis direction.

The control module 104 of this embodiment is configured to adjust a size of a spot 202 of the laser emitted by the emitting module 101, for example, a radius of the spot 202, based on the width D of the cement obtained by the detecting module 103.

As exemplary description, referring to FIG. 2, assuming that energy for melting glass cement is J, the following can be known from physics formulas:

$J=W$(power of the emitting module for emitting laser)·$T$(cement heating time);

$T=S$(a laser scanning length)/$V$(a laser scanning speed, i.e., a speed at which the irradiation area is moved).

Then, $S=JV/W$;

When J, W and V are preset values, the relationship between the laser scanning length S, the radius of the spot R and width of the cement D is: $S^2+D^2=4R^2$.

Through conversion of the above formulas, you will get $$R = \frac{\sqrt{\left(\frac{JV}{W}\right)^2 + D^2}}{2}.$$

Thus, the control module 104 of this embodiment can adjust the radius R of the spot 202 of the laser emitted by the emitting module 101 based on the formula $$R = \frac{\sqrt{\left(\frac{JV}{W}\right)^2 + D^2}}{2},$$

In the above formula, there is a preset correspondence between the energy J required for melting the cement and the information about a material of the cement.

For example, the correspondence between the information about the material of the cement and the J value in the above formula is prior knowledge, which can be determined by test for example. The control module 104 of this embodiment may store this correspondence, and may determine a corresponding value of J based on the information about the material of the cement and gives the radius R of the spot 202 of the laser emitted by the emitting module, which is calculated from the above formula. Thereafter, the emitting module 101 emits laser with the radius R of the spot 202, and the emitted laser just melts the irradiated cement.

For example, in one example of this embodiment, the energy for melting the cement is 0.6 J, the laser scanning speed V of the emitting module 101 is 20 mm/s, the power W of the emitting module 101 for emitting the laser is 15 w. When the width D of the cement obtained by the detecting module 103 is 1.2 mm, the control module 104 adjusts the radius R of the spot 202 of the laser emitted by the emitting module 101 to 1 mm based on the above formula.

It shall be noted that, the cement in this embodiment is not limited to the glass cement, and any cement used for encapsulation is applicable to the cement sintering device of this embodiment.

Therefore, the control module 104 can store correspondences between widths of cements made of different materials and values of J. In one example, the control module 104 may be set in advance based on the material of the cement to be actually sintered so that the control module 104 can give correct energy J required for melting the cement.

One embodiment of the cement sintering device of the present disclosure has been described above. It can thus be known that the cement sintering device of this embodiment has the following advantages when it is used to sinter a cement for encapsulating display products:

1) it being possible to rapidly adjust the size of the laser spot based on the structure of the cement to be actually sintered, so as to make the laser energy match with the size of the structure of the cement, thereby to improve the sintering quality and allow for better product encapsulating effect of the encapsulation cement;

2) reducing involvement of humans and avoiding abnormal product quality caused by human operational errors; and 3) reducing the risk of damage to the display device by laser.

Figure 3:
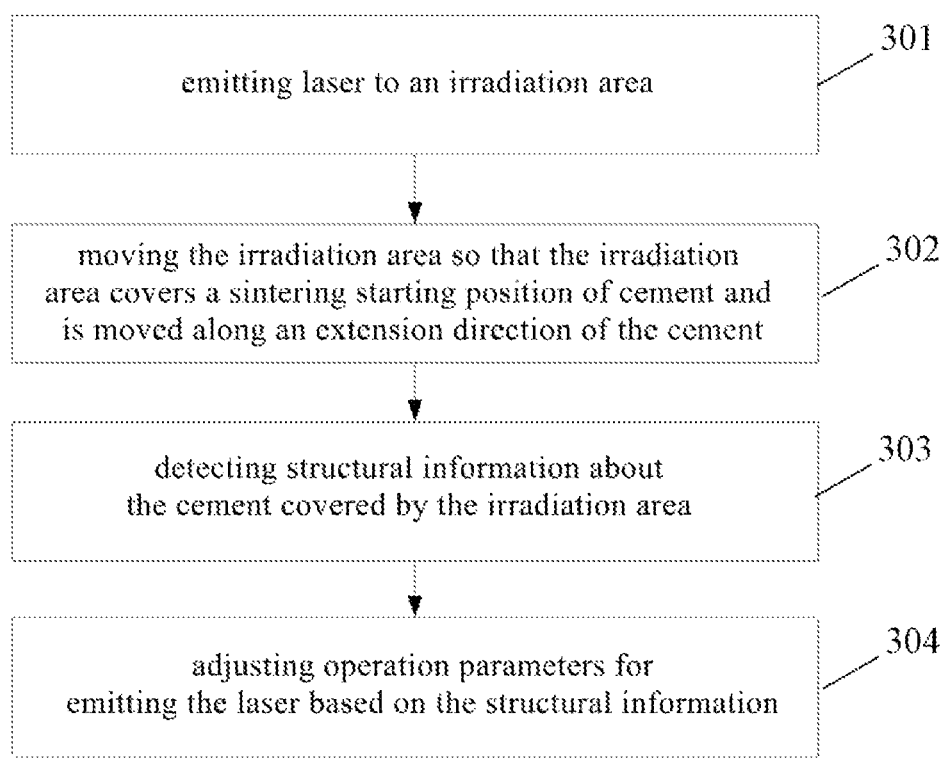
FIG. 3 is a schematic view showing steps of a cement sintering method provided in an embodiment of the present disclosure.

One embodiment of the present disclosure provides a cement sintering method, which includes the following steps as shown in FIG. 3:

Step 301: emitting laser to an irradiation area;

Step 302: moving the irradiation area so that the irradiation area covers a sintering starting position of cement and is moved along an extension direction of the cement;

Step 303: detecting structural information about the cement covered by the irradiation area; and Step 304: adjusting operation parameters for emitting the laser based on the structural information.

For example, the structural information in this embodiment includes a width of the cement in a first direction and the first direction is perpendicular to the extension direction of the cement.

For example, the operation parameters include a size of a spot formed by the emitted laser, such as a radius of the spot formed by the emitted laser.

Assume that the radius of the spot is R, $$R = \frac{\sqrt{\left(\frac{JV}{W}\right)^2 + D^2}}{2}.$$

In the above formula, D is the detected width of the cement, J is energy required for melting the cement and there is a preset correspondence between the energy and the information about the material of the cement; V is a speed at which the irradiation area is moved by the moving module, and W is power of the emitting module for emitting the laser.

For example, in one example of this embodiment, the energy J required for melting the cement known from the prior knowledge is 0.6 J, the laser scanning speed V is 20 mm/s, the power W for emitting the laser is 15w. When the detected width D of the cement is 1.2 mm, the radius R of the spot formed by the emitted laser is adjusted to 1 mm based on the above formula.

The cement sintering method of this embodiment corresponds to the cement sintering device provided in the aforementioned embodiment of the present disclosure, and thus can also achieve the same technical effects as the cement sintering device of the aforementioned embodiment.

Below, one embodiment of the cement sintering method of the present disclosure will be described in detail.

Figure 4:
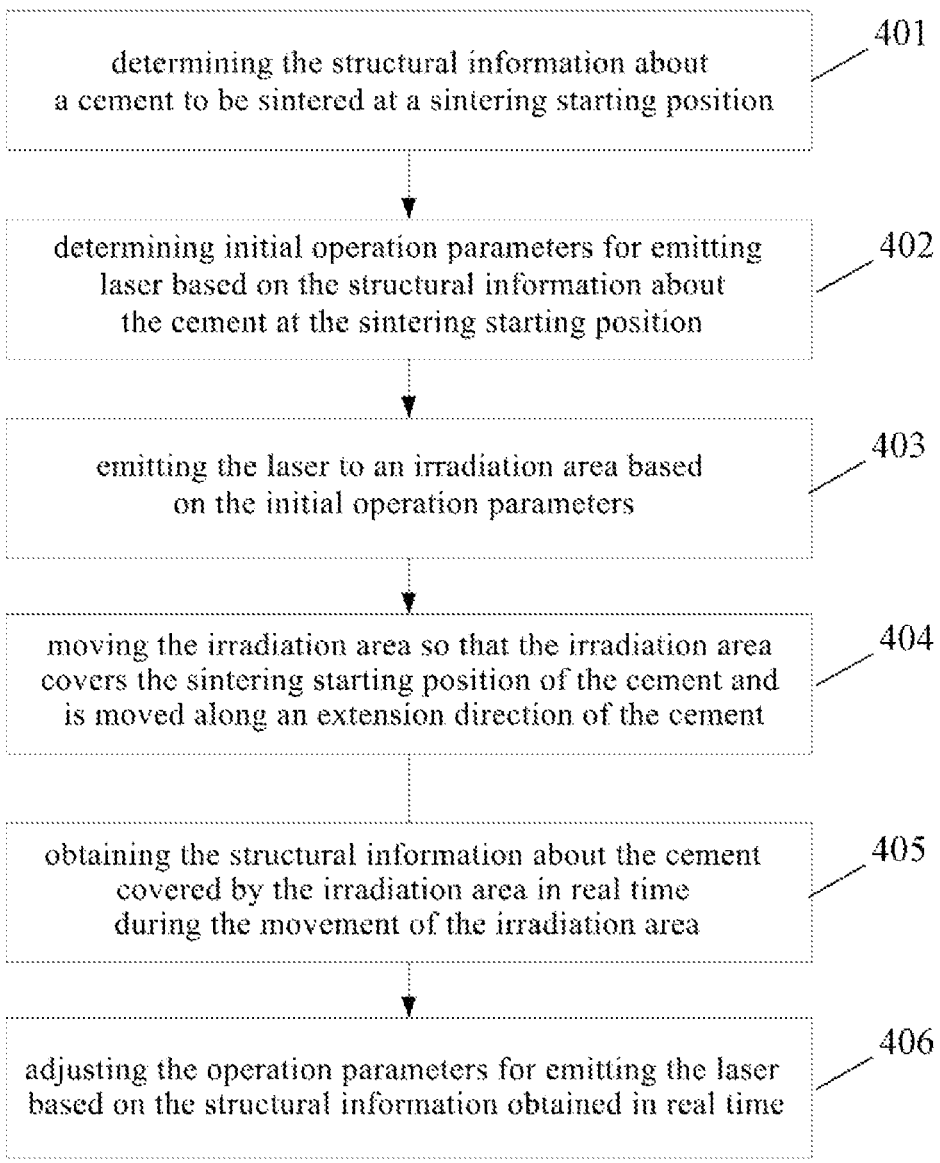
FIG. 4 is a schematic view showing a flow chart of the cement sintering method provided in the embodiment of the present disclosure in one application.

As shown in FIG. 4, one embodiment of the cement sintering method of the present disclosure includes the following steps.

In step 401, structural information about a cement to be sintered at a sintering starting position is determined.

For example, a width D of the cement at the sintering starting position in a first direction is determined.

In step 402, initial operation parameters for emitting laser is determined based on the structural information about the cement at the sintering starting position.

For example, based on the width D determined in step 401, energy J required for melting the cement at the corresponding sintering starting position is determined; thereafter, the energy J is put into the formula for calculating the radius R of the laser spot as described above, so as to calculate the radius R of the laser spot.

In step 403, laser is emitted to an irradiation area based on the initial operation parameters.

For example, the radius of the spot formed by the emitted laser is R which has been determined in step 402.

In step 404, the irradiation area is moved so that it covers the sintering starting position of the cement and is moved along an extension direction of the cement.

For example, the irradiation area is controlled to be moved along the extension direction of the cement until the completion of the sintering of the cement.

In step 405, during the movement of the irradiation area, structural information about the cement covered by the irradiation area is obtained in real time.

For example, a width D of the cement covered by the irradiation area in a first direction is obtained in real time.

In step 406, operation parameters for emitting the laser are adjusted based on the structural information obtained in real time.

For example, based on the width D determined in step 405, energy J required for melting the cement covered by the irradiation area is determined, and then the radius R of the spot formed by the emitted laser is adjusted based on the value of J.

For example, in one example of this embodiment, the energy J required for melting the cement known from the prior knowledge is 0.6 J, the laser scanning speed V is 20 mm/s, the power W for emitting the laser is 15w. Thus, when the width Do of the cement at the sintering starting position is detected to be 1.2 mm, an initial radius Ro of the spot formed by the emitted laser will be adjusted to 1 mm according to the above formula, and then the irradiation area is moved to cover the sintering starting position of the cement and laser is emitted to the irradiation area. Thereafter, the irradiation area is moved along the extension direction of the cement, and a width $D_x$ of the cement in the irradiation area in a first direction is obtained in real time. For example, when $D_x$ is detected to be 1.8 mm, the radius $R_x$ of the emitted laser spot will be adjusted to 1.5 mm according to the above formula, and then the adjusted laser is emitted to the irradiation area.

The cement sintering method of this embodiment corresponds to the cement sintering device provided in the aforementioned embodiment of the present disclosure, and thus can achieve the same technical effects as the cement sintering device of the aforementioned embodiment.

The above are preferred embodiments of the present disclosure. It shall be indicated that several improvements and modifications can be also made by a person having ordinary skills in the art without departing from the principle of the present disclosure, and such improvements and modifications should be also deemed as falling within the scope of the present disclosure.

Technical or scientific terms used herein should have the same meanings as commonly understood by a person having ordinary skills in the art to which the present disclosure pertains, unless otherwise defined. The terms "comprising", "including" etc. used in the present disclosure are intended to specify that the elements or the objects stated before these terms encompass the elements or the objects and equivalents thereof listed after these terms, but do not preclude other elements or objects. Also, the phrases "operation parameters" and "structural information" transmitted between the above modules are not intended to interact between these modules only through a physical connection, but they can interact through an indirect connection.

What is claimed is:

1. A cement sintering device, comprising:
   an emitting module configured to emit laser to an irradiation area corresponding to the emitting module;
   a moving module configured to control the irradiation area of the emitting module to move so that the irradiation area covers a cement to be sintered and is moved along an extension direction of the cement;
   a detecting module configured to detect structural information about the cement covered by the irradiation area, wherein the structural information comprises a width of the cement covered by the irradiation area in a first direction, where the first direction is perpendicular to the extension direction of the cement; and
   a control module configured to adjust operation parameters of the emitting module for emitting the laser based on the structural information.

2. The cement sintering device according to claim 1, wherein the moving module is further configured to move the irradiation area by moving the emitting module or by changing a laser emitting angle of the emitting module.

3. The cement sintering device according to claim 1, wherein the control module is further configured to adjust a size of a spot formed by the laser emitted by the emitting module based on the width of the cement obtained by the detecting module.

4. The cement sintering device according to claim 3, wherein the control module is further configured to adjust a radius R of the spot formed by the laser emitted by the emitting module according to a formula $$R = \frac{\sqrt{\left(\frac{JV}{W}\right)^2 + D^2}}{2},$$

wherein D is the width of the cement obtained by the detecting module, J is energy required for melting the cement and there is a preset correspondence between the energy and information about a material of the cement; V is a speed at which the irradiation area is moved by the moving module, and W is power of the emitting module for emitting the laser.

5. The cement sintering device according to claim 4, wherein the control module is further configured to store therein the preset correspondence between the energy J required for melting the cement and the information about the material of the cement.

6. The cement sintering device according to claim 1, wherein the cement sintering device comprises at least one emitting module, each emitting module corresponds to one moving module and one detecting module, each moving module is configured to control the irradiation area of the corresponding emitting module to move, and each detecting module is configured to detect the structural information about the cement covered by the irradiation area of the corresponding emitting module.

7. A cement sintering method, comprising:
emitting laser to an irradiation area;
moving the irradiation area so that the irradiation area covers a sintering starting position of cement and is moved along an extension direction of the cement;
detecting structural information about the cement covered by the irradiation area; and
adjusting operation parameters for emitting the laser based on the structural information, wherein the structural information comprises a width of the cement in a first direction and the first direction is perpendicular to the extension direction of the cement.

8. The cement sintering method according to claim 7, comprising:
determining the structural information about the cement to be sintered at a sintering starting position;
determining initial operation parameters for emitting the laser based on the structural information about the cement at the sintering starting position;
emitting the laser to the irradiation area based on the initial operation parameters;
moving the irradiation area so that the irradiation area covers the sintering starting position of the cement and is moved along the extension direction of the cement;
obtaining the structural information about the cement covered by the irradiation area in real time during the movement of the irradiation area; and
adjusting the operation parameters for emitting the laser based on the structural information obtained in real time.

9. The cement sintering method according to claim 7, wherein the operation parameters comprise a size of a spot formed by the emitted laser.

10. The cement sintering method according to claim 9, wherein the operation parameters comprises a radius of the spot formed by the emitted laser.

11. The cement sintering method according to claim 10, wherein the radius R of the spot is calculated according to $$R = \frac{\sqrt{\left(\frac{JV}{W}\right)^2 + D^2}}{2},$$

wherein D is the width of the cement detected, J is energy required for melting the cement and there is a preset correspondence between the energy and information about a material of the cement; V is a speed at which the irradiation area is moved, and W is power for emitting the laser.

12. The cement sintering method according to claim 8, wherein the structural information comprises a width of the cement in a first direction and the first direction is perpendicular to the extension direction of the cement.

13. The cement sintering method according to claim 12, wherein the operation parameters comprise a size of a spot formed by the emitted laser.

14. The cement sintering method according to claim 13, wherein the operation parameters comprises a radius of the spot formed by the emitted laser.

15. The cement sintering method according to claim 14, wherein the radius R of the spot is calculated according to $$R = \frac{\sqrt{\left(\frac{JV}{W}\right)^2 + D^2}}{2},$$

wherein D is the width of the cement detected, J is energy required for melting the cement and there is a preset correspondence between the energy and information about a material of the cement; V is a speed at which the irradiation area is moved, and W is power for emitting the laser.

* * * * *